(12) United States Patent
Buell

(10) Patent No.: US 7,564,268 B2
(45) Date of Patent: Jul. 21, 2009

(54) LOW POWER LOGIC OUTPUT BUFFER

(75) Inventor: Brian J. Buell, Gilbert, AZ (US)

(73) Assignee: Integrated Device Technology, inc, San Jose, CA (US)

( * ) Notice: Subject to any disclaimer, the term of this patent is extended or adjusted under 35 U.S.C. 154(b) by 0 days.

(21) Appl. No.: 11/557,320

(22) Filed: Nov. 7, 2006

(65) Prior Publication Data

US 2008/0122487 A1 May 29, 2008

(51) Int. Cl.
 *H03K 19/20* (2006.01)
(52) U.S. Cl. .......................... 326/115; 326/86; 326/127
(58) Field of Classification Search ................. 326/83, 326/86, 112, 115, 121, 127
 See application file for complete search history.

(56) References Cited

U.S. PATENT DOCUMENTS

| 5,191,555 | A | 3/1993 | Tabacco et al. |
| 6,366,140 | B1 * | 4/2002 | Warwar ....................... 327/108 |
| 6,594,361 | B1 | 7/2003 | Chaney et al. |
| 6,664,853 | B1 * | 12/2003 | Sun et al. ..................... 330/253 |
| 6,703,879 | B2 | 3/2004 | Okuda et al. |
| 6,798,249 | B2 * | 9/2004 | Wong et al. .................. 326/115 |
| 6,937,080 | B2 * | 8/2005 | Hairapetian .................. 327/210 |
| 6,958,632 | B2 | 10/2005 | Nair |
| 7,196,551 | B2 * | 3/2007 | Lee ............................. 326/115 |
| 7,288,971 | B1 * | 10/2007 | Plasterer et al. ............. 326/127 |
| 2005/0286333 | A1 | 12/2005 | Gupta et al. |

FOREIGN PATENT DOCUMENTS

JP          3117914          5/1991

* cited by examiner

*Primary Examiner*—James H. Cho
*Assistant Examiner*—Christopher Lo
(74) *Attorney, Agent, or Firm*—Panitch, Schwarze, et al.

(57) ABSTRACT

A low power logic output buffer includes first and second logic gates, each having an input and an output. The input of the first logic gate receives a first logic signal, and the input of the second logic gate receives a second logic signal. The buffer includes first, second, third and fourth n-type metal oxide semiconductor (NMOS). The buffer also includes first and second bias switching NMOS. The first bias switching NMOS is coupled between the source of the third NMOS and ground, and the gate of the first bias switching NMOS is coupled to the output of the first logic gate. The second bias switching NMOS is electrically coupled between the source of the fourth NMOS and ground, and the gate of the second bias switching NMOS is coupled to the output of the second logic gate.

16 Claims, 4 Drawing Sheets

US 7,564,268 B2

LOW POWER LOGIC OUTPUT BUFFER

BACKGROUND OF THE INVENTION

Embodiments of the present invention relate generally to a logic output buffer, and more particularly, to a low power logic output buffer.

Integrated circuits (ICs) which have logic output buffers are known in the art. A logic output buffer generally receives clock signals CLK and /CLK (i.e., complement of clock CLK) and provides output signals OUT and /OUT (i.e., complement of OUT) which are delayed versions of the clock signals CLK and /CLK. The clock signals CLK and /CLK are typically full swing from a rail supply voltage Vdd1 and ground GND.

An n-type metal oxide semiconductor (NMOS) source follower output buffer can effectively drive a large load, but typically requires a large amount of power supply current and/or a large die size. FIG. 1 shows a conventional NMOS source follower control circuit 100 which is commonly used as a logic output buffer. The conventional NMOS source follower control circuit 100 typically has a relatively high input impedance and a relatively low output impedance. The conventional NMOS source follower control circuit 100 includes input logic gates 1136 and 1139 (NOT gates) which receive clock signals CLK and /CLK, respectively. The conventional NMOS source follower control circuit 100 also includes transistors MN0, MN1, MN2, MN15 and MN16 and biasing resistors R65-R68. Transistors MN0 and MN1 are driven from the outputs of logic gates 1136 and 1139, respectively. The drain of each transistor MN0, MN1 is coupled to the gate of output transistors MN15, MN16, respectively, and to rail voltage Vdd1 dropped through biasing resistors R65, R66, respectively. The sources of both transistors MN0, MN1 are coupled to the drain of bias transistor MN2. The bias transistor MN2 is driven by a bias voltage $V_{bias}$ and the source of bias transistor MN2 is coupled to ground GND. The drains of both output transistors MN15 and MN16 are coupled to the rail voltage Vdd1 and the sources are respectively coupled to the output pads OUT and /OUT with bias resistors R67, R68 coupled to ground. The bias resistors R67, R68 provide pull-down current for outputs OUT and /OUT which must be strong enough to drive the output load (not shown) during a falling edge of either output OUT or /OUT. The large bias current can be problematic. For example, the rising edge of either output OUT or /OUT is slowed because the source follower transistors MN15, MN16 must drive both the load and the bias resistors R67, R68. This means that transistors MN15, MN16 are constantly dissipating power. Further, the power supply current required for the circuit 100 is relatively large and the circuit 100 generates a relatively large amount of heat.

FIG. 2 shows another conventional NMOS source follower control circuit 200 which is commonly used as a logic output buffer. The conventional NMOS source follower control circuit 200 includes input logic gates 1149 and 1146 (NOT gates) which receive clock signals CLK and /CLK, respectively. The conventional NMOS source follower control circuit 200 also includes transistors MN3, MN4, MN5, MN6, MN7, MN8, MN17 and MN18 and biasing resistors R71-R72. Transistors MN3 and MN4 are driven from the outputs of logic gates 1146 and 1149, respectively. The drain of each transistor MN3, MN4 is coupled to the gate of output transistors MN17, MN18, respectively, and to rail voltage Vdd1 dropped through biasing resistors R71, R72, respectively. The sources of both transistors MN3, MN4 are coupled to the drain of bias transistor MN5. The bias transistor MN5 is driven by a bias voltage $V_{bias}$ and the source of bias transistor MN5 is coupled to ground GND. The drains of both output transistors MN17 and MN18 are coupled to the rail voltage Vdd1 and the sources are respectively coupled to the output pads OUT and /OUT. The sources of transistors MN17 and MN18 are also coupled to the drains of bias transistors MN8 and MN7, respectively. The gates of the bias transistors MN8 and MN7 are driven by the outputs of logic gates 1146 and 1149, respectively. The sources of both bias transistors MN7, MN8 are coupled to the drain of bias transistor MN6. The bias transistor MN6 is driven by the bias voltage $V_{bias}$ and the source of bias transistor MN6 is coupled to ground GND. The transistors MN7 and MN8 provide current steering for the source follower transistors MN17, MN18. The bias current is only directed to one of the source follower transistors MN17, MN18 at a time which improves the edge rate and reduces power supply current and heat generation. But, the current steering bias technique requires relatively large current bias or steering transistors MN7 and MN8.

It is desirable to provide a low power logic output buffer that uses a switched bias with a reduced effective load and a smaller footprint die size than conventional logic output buffers.

BRIEF SUMMARY OF THE INVENTION

Briefly stated, an embodiment of the present invention comprises a low power logic output buffer includes first and second logic gates, each having an input and an output. The input of the first logic gate receives a first logic signal, and the input of the second logic gate receives a second logic signal. The buffer includes first, second, third and fourth n-type metal oxide semiconductor (NMOS). Each NMOS has a source, a drain and a gate. The source and the drain of the first NMOS are electrically coupled between a rail supply voltage (Vdd1) and a bias to ground, and the gate of the first NMOS is electrically coupled to the output of the first logic gate. The source and the drain of the second NMOS are electrically coupled between the rail supply voltage (Vdd1) and the bias to ground, and the gate of the second NMOS is electrically coupled to the output of the second logic gate. The third NMOS is electrically coupled between the rail supply voltage (Vdd1) and the first buffer output, and the gate of the third NMOS is electrically coupled to the drain of the first NMOS. The source and the drain of the fourth NMOS are electrically coupled between the rail supply voltage (Vdd1) and the second buffer output, and the gate of the fourth NMOS is electrically coupled to the drain of the second NMOS. The buffer also includes first and second bias switching NMOS. The source and the drain of the first bias switching NMOS are electrically coupled between the source of the third NMOS and ground, and the gate of the first bias switching NMOS is electrically coupled to the output of the first logic gate. The source and the drain of the second bias switching NMOS are electrically coupled between the source of the fourth NMOS and ground, and the gate of the second bias switching NMOS is electrically coupled to the output of the second logic gate.

Another embodiment of the present invention comprises a low power logic output buffer including first and second logic gates. The first logic gate has an input and an output. The input of the first logic gate receives a first logic signal. The second logic gate has an input and an output. The input of the second logic gate receives a second logic signal. The buffer includes first buffer output that outputs a first output signal and a second buffer output that outputs a second output signal. The buffer includes first and second bias switching NMOS. The first bias switching NMOS has a gate, a source and a drain.

The source and the drain of the first bias switching NMOS are electrically coupled between the first buffer output and ground. The source of the first bias switching NMOS is directly connected to ground. The gate of the first bias switching NMOS is electrically coupled to the output of the first logic gate. The second bias switching NMOS has a gate, a source and a drain. The source and the drain of the second bias switching NMOS are electrically coupled between the second buffer output and ground. The source of the second bias switching NMOS is directly connected to ground. The gate of the second bias switching NMOS is electrically coupled to the output of the second logic gate.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
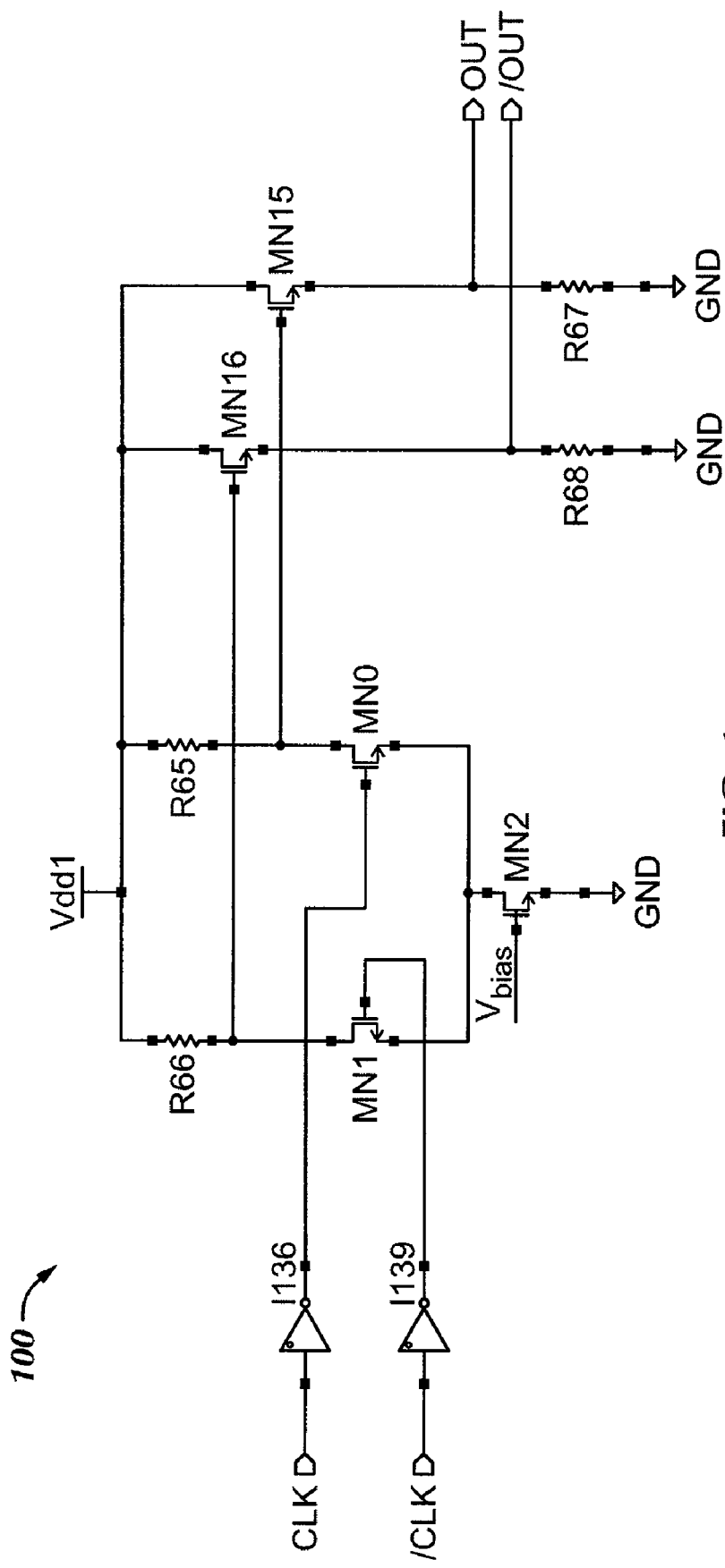
FIG. 1 is an electrical schematic diagram of a conventional logic output buffer using source follower output transistors and bias resistors.

Certain terminology is used in the following description for convenience only and is not limiting. The words "right," and "left," "lower," and "upper" designate directions in the drawings to which reference is made. The words "inwardly" and "outwardly" refer to directions toward and away from, respectively, the geometric center of the object discussed and designated parts thereof. The terminology includes the words above specifically mentioned, derivatives thereof and words of similar import. Additionally, the words "a" and "an", as used in the claims and in the corresponding portions of the Specification, means "at least one."

As described herein, the transistors are n-channel metal-oxide-semiconductor (NMOS) devices. Alternatively, the transistors could be p-channel metal-oxide-semiconductor (PMOS) devices. A metal-oxide-semiconductor (MOS) transistor includes a gate, a drain and a source. The use of source and drain is relative to voltage applied thereto and should not be construed as limiting.

Figure 3:
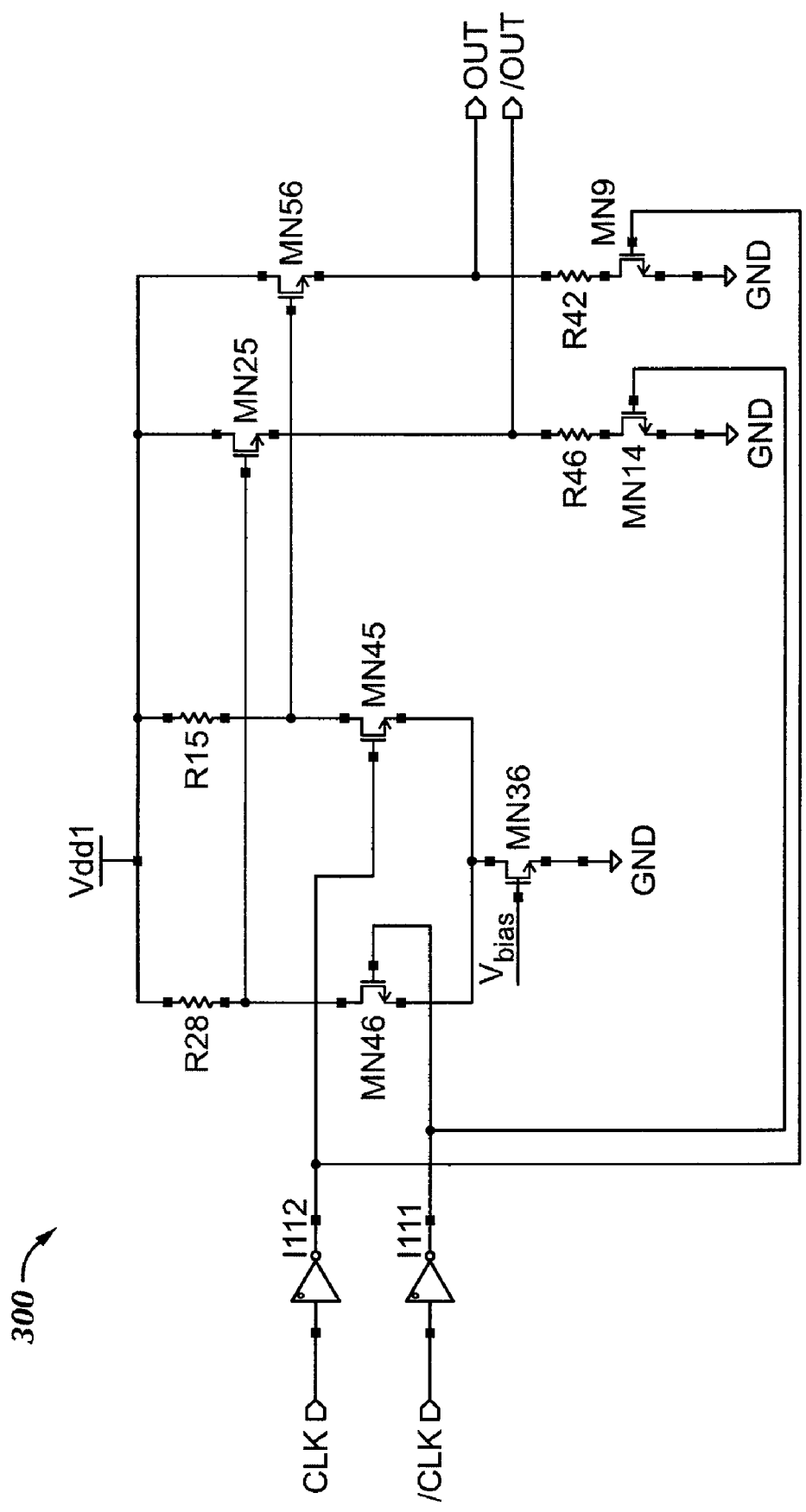
FIG. 3 is an electrical schematic diagram of a low power logic output buffer in accordance with a first preferred embodiment of the present invention.

Referring to the drawings in detail, wherein like reference numerals indicate like elements throughout, there is shown in FIG. 3 an electrical schematic diagram of a low power logic output buffer control circuit 300 in accordance with a first preferred embodiment of the present invention. In the presently preferred embodiment, the low power logic output buffer control circuit 300 has a relatively high input impedance and a relatively low output impedance. The low power logic output buffer control circuit 300 includes input logic gates 1112 and 1111 (NOT gates) which receive clock signals CLK and /CLK, respectively. The low power logic output buffer control circuit 300 includes a first buffer output OUT that outputs a first output signal and a second buffer output /OUT that outputs a second output signal. The NMOS source follower control circuit 300 also includes transistors MN45, MN46, MN36, MN25, MN56, MN9 and MN14 and biasing resistors R28, R15, R42 and R46. Transistors MN45 and MN46 are driven from the outputs of logic gates 1112 and 1111, respectively. The drain of each transistor MN45, MN46 is coupled to the gate of output transistors MN56, MN25, respectively, and to rail voltage Vdd1 through biasing resistors R15, R28, respectively. The sources of both transistors MN45, MN46 are coupled to the drain of bias transistor MN36. The bias transistor MN36 is driven by a bias voltage $V_{bias}$ and the source of bias transistor MN36 is coupled to ground GND.

The drains of both output transistors MN56 and MN25 are coupled to the rail voltage Vdd1 and the sources are respectively coupled to the output pads OUT and /OUT. The sources of the output transistors MN56, MN25 are coupled to the drains of bias transistors MN9, MN14, respectively, through bias resistors R42, R46. The sources of bias transistors MN9, MN14 are coupled to ground. Preferably, the sources of both bias transistors MN9, MN14 are directly connected to ground GND. The gates of the bias transistors MN9, MN14 are driven by the outputs of logic gates 1112, 1111, respectively. The bias transistors MN9, MN14 and bias resistors R42, R46 provide pull-down current for the outputs OUT and /OUT. The switched bias provided by bias transistors MN9, MN14 is similar to the current steering technique of the source follower control circuit 200 of FIG. 2, but allows for using relatively smaller bias switching transistors MN9, MN14. The relatively smaller bias switching transistors MN9, MN14 present a lighter load to the logic gates 1112, 1111, and require a relatively smaller die size.

Optionally, the low power logic output buffer control circuit 300 is formed in an integrated circuit (IC).

Figure 4:
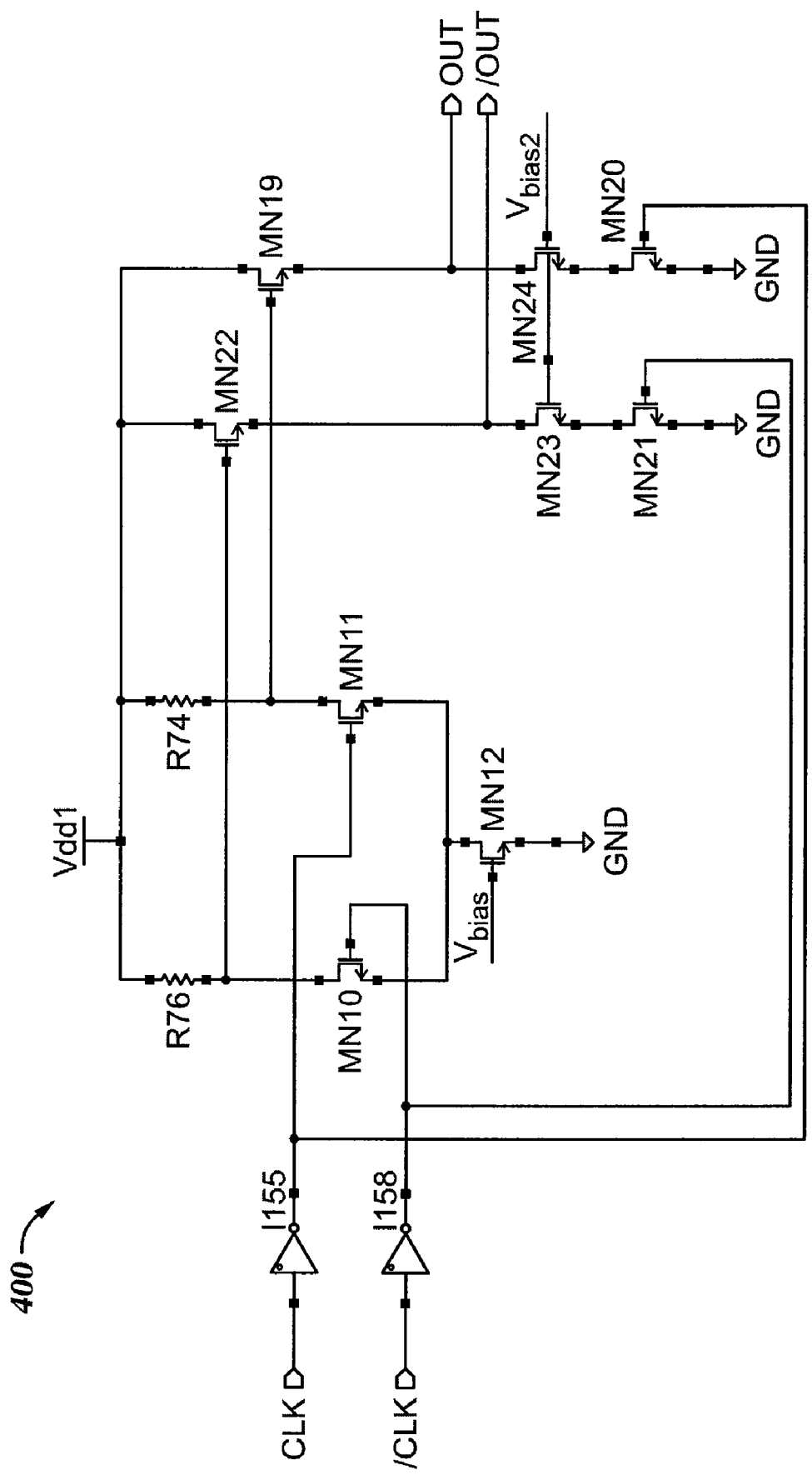
FIG. 4 is an electrical schematic diagrams of a low power logic output buffer in accordance with a second preferred embodiment of the present invention.

FIG. 4 shows an electrical schematic diagram of a low power logic output buffer control circuit 400 in accordance with a second preferred embodiment of the present invention. The low power logic output buffer control circuit 400 includes input logic gates 1155 and 1158 (NOT gates) which receive clock signals CLK and /CLK, respectively. The low power logic output buffer control circuit 400 includes first buffer output OUT that outputs a first output signal and a second buffer output /OUT that outputs a second output signal. The low power logic output buffer control circuit 400 also includes transistors MN10, MN11, MN12, MN19, MN22, MN20, MN21, MN23 and MN24 and biasing resistors R74, R76. Transistors MN11 and MN10 are driven from the outputs of logic gates 1155 and 1158, respectively. The drain of each transistor MN11, MN10 is coupled to the gate of output transistors MN19, MN22, respectively, and to the rail supply voltage Vdd1 through biasing resistors R74, R76, respectively. The sources of both transistors MN11, MN10 are coupled to the drain of bias transistor MN12. The bias transistor MN12 is driven by a bias voltage $V_{bias}$ and the source of bias transistor MN12 is coupled to ground GND. The drains of both output transistors MN19 and MN22 are coupled to the rail voltage Vdd1 and the sources are respectively coupled to the output pads OUT and /OUT. The sources of transistors MN19 and MN22 are also coupled to the drains of bias transistors MN24 and MN23, respectively. The gates of bias transistors MN24, MN23 are driven by another bias voltage $V_{bias2}$. The source of each bias transistor MN24, MN23 is coupled to the drain of bias switching transistor MN20, MN21, respectively. The gates of the bias switching transistors MN20 and MN21 are driven by the outputs of logic gates 1155 and 1158, respectively. The sources of both bias transistors MN20, MN21 are coupled to ground GND. Preferably, the sources of both bias transistors MN20, MN21 are directly connected to ground GND.

In the preferred embodiments, each bias switching transistor MN9, MN14 and MN20, MN21 is coupled between the negative supply (ground GND) and a bias element such as resistors R42, R46 or bias transistors MN24, MN23. The respective bias element R42, R46 and MN24, MN23 is coupled to the NMOS source follower transistor MN56, MN25 and MN19, MN22. The gates of each bias switching transistor MN9, MN14 and MN20, MN21 are driven by the respective logic gate outputs 1112, 1111 and 1155, 1158.

Optionally, the low power logic output buffer control circuit 400 is formed in an IC.

Figure 2:
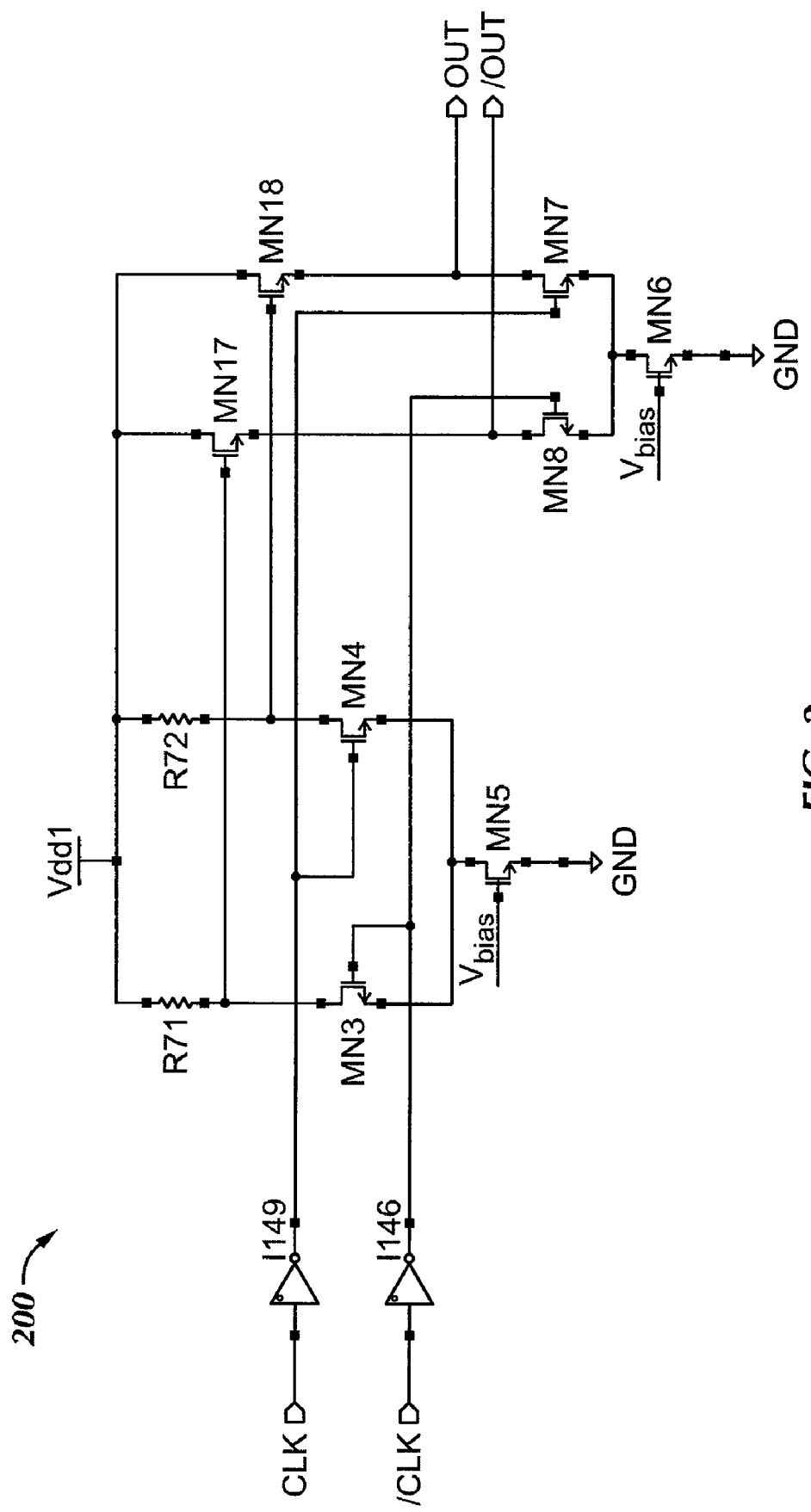
FIG. 2 is an electrical schematic diagram of another conventional logic output buffer using source follower output transistors and current steering bias transistors.

The prior art of FIG. 2 also exhibits overshoot on the output (OUT, /OUT) due to the coupling of the gate-drain capacitance of transistors MN7, MN8. This effect is reduced in the circuits 300, 400 of FIG. 3 and FIG. 4, respectively, due to the resistors R42, R46 or transistors MN24, MN23 that are placed between the switching transistors and the outputs (OUT, /OUT).

From the foregoing, it can be seen that the present invention comprises low power logic output buffer. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A low power logic output buffer consisting of:
   a first logic gate having an input and an output, the input of the first logic gate receiving a first logic signal;
   a second logic gate having an input and an output, the input of the second logic gate receiving a second logic signal;
   a first buffer output that outputs a first output signal;
   a second buffer output that outputs a second output signal;
   a first n-type metal oxide semiconductor (NMOS) having a gate, a source and a drain, the source and the drain of the first NMOS being electrically coupled between a rail supply voltage (Vdd1) and a bias to ground, the gate of the first NMOS being electrically coupled to the output of the first logic gate;
   a second NMOS having a gate, a source and a drain, the source and the drain of the second NMOS being electrically coupled between the rail supply voltage (Vdd1) and the bias to ground, the gate of the second NMOS being electrically coupled to the output of the second logic gate;
   a third NMOS having a gate, a source and a drain, the source and the drain of the third NMOS being electrically coupled between the rail supply voltage (Vdd1) and the first buffer output, the gate of the third NMOS being electrically coupled to the drain of the first NMOS;
   a fourth NMOS having a gate, a source and a drain, the source and the drain of the fourth NMOS being electrically coupled between the rail supply voltage (Vdd1) and the second buffer output, the gate of the fourth NMOS being electrically coupled to the drain of the second NMOS;
   a first bias switching NMOS having a gate, a source and a drain, the source and the drain of the first bias switching NMOS being electrically coupled between the source of the third NMOS and ground, the gate of the first bias switching NMOS being electrically coupled to the output of the first logic gate;
   a second bias switching NMOS having a gate, a source and a drain, the source and the drain of the second bias switching NMOS being electrically coupled between the source of the fourth NMOS and ground, the gate of the second bias switching NMOS being electrically coupled to the output of the second logic gate;
   a first bias NMOS having a gate, a source and a drain, the source and the drain of the first bias NMOS being coupled between the first buffer output and the drain of the first bias switching NMOS, the gate of the first bias NMOS being driven by a bias voltage; and
   a second bias NMOS having a gate, a source and a drain, the source and the drain of the second bias NMOS being coupled between the second buffer output and the drain of the second bias switching NMOS, the gate of the second bias NMOS being driven by the bias voltage.

2. A low power logic output buffer consisting of:
   a first logic gate having an input and an output, the input of the first logic gate receiving a first logic signal;
   a second logic gate having an input and an output, the input of the second logic gate receiving a second logic signal;
   a first buffer output that outputs a first output signal;
   a second buffer output that outputs a second output signal;
   a first n-type metal oxide semiconductor (NMOS) having a gate, a source and a drain, the source and the drain of the first NMOS being electrically coupled between a rail supply voltage (Vdd1) and a bias to ground, the gate of the first NMOS being electrically coupled to the output of the first logic gate;
   a second NMOS having a gate, a source and a drain, the source and the drain of the second NMOS being electrically coupled between the rail supply voltage (Vdd1) and the bias to ground, the gate of the second NMOS being electrically coupled to the output of the second logic gate;
   a third NMOS having a gate, a source and a drain, the source and the drain of the third NMOS being electrically coupled between the rail supply voltage (Vdd1) and the first buffer output, the gate of the third NMOS being electrically coupled to the drain of the first NMOS;
   a fourth NMOS having a gate, a source and a drain, the source and the drain of the fourth NMOS being electrically coupled between the rail supply voltage (Vdd1) and the second buffer output, the gate of the fourth NMOS being electrically coupled to the drain of the second NMOS;
   a first bias switching NMOS having a gate, a source and a drain, the source and the drain of the first bias switching NMOS being electrically coupled between the source of the third NMOS and generally constant voltage ground, the source of the first bias switching NMOS being directly coupled to generally constant voltage ground, the gate of the first bias switching NMOS being electrically coupled to the output of the first logic gate;
   a second bias switching NMOS having a gate, a source and a drain, the source and the drain of the second bias switching NMOS being electrically coupled between the source of the fourth NMOS and generally constant voltage ground, the source of the first bias switching NMOS being directly coupled to generally constant voltage ground, the gate of the second bias switching NMOS being electrically coupled to the output of the second logic gate;
a first bias resistor coupled between the first buffer output and the drain of the first bias switching NMOS; and
a second bias resistor coupled between the second buffer output and the drain of the second bias switching NMOS.

3. The low power logic output buffer of claim 1, wherein the low power logic output buffer is formed in an integrated circuit (IC).

4. The low power logic output buffer of claim 1, wherein the first logic signal and the second logic signal are complementary.

5. The low power logic output buffer of claim 1, wherein the first logic signal and the second logic signal are clock (CLK) and complementary clock (/CLK).

6. A low power logic output buffer consisting of:
a first logic gate having an input and an output, the input of the first logic gate receiving a first logic signal;
a second logic gate having an input and an output, the input of the second logic gate receiving a second logic signal;
a first buffer output that outputs a first output signal;
a second buffer output that outputs a second output signal;
a first bias switching n-type metal oxide semiconductor (NMOS) having a gate, a source and a drain, the source and the drain of the first bias switching NMOS being electrically coupled between the first buffer output and ground, the source of the first bias switching NMOS being directly connected to ground, the gate of the first bias switching NMOS being electrically coupled to the output of the first logic gate;
a second bias switching NMOS having a gate, a source and a drain, the source and the drain of the second bias switching NMOS being electrically coupled between the second buffer output and ground, the source of the second bias switching NMOS being directly connected to ground, the gate of the second bias switching NMOS being electrically coupled to the output of the second logic gate;
a first bias NMOS having a gate, a source and a drain, the source and the drain of the first bias NMOS being coupled between the first buffer output and the source of the first bias switching NMOS, the gate of the first bias NMOS being driven by a bias voltage; and
a second bias NMOS having a gate, a source and a drain, the source and the drain of the second bias NMOS being coupled between the second buffer output and the source of the second bias switching NMOS, the gate of the second bias NMOS being driven by the bias voltage.

7. A low power logic output buffer consisting of:
a first logic gate having an input and an output, the input of the first logic gate receiving a first logic signal;
a second logic gate having an input and an output, the input of the second logic gate receiving a second logic signal;
a first buffer output that outputs a first output signal;
a second buffer output that outputs a second output signal;
a first bias switching n-type metal oxide semiconductor (NMOS) having a gate, a source and a drain, the source and the drain of the first bias switching NMOS being electrically coupled between the first buffer output and generally constant voltage ground, the source of the first bias switching NMOS being directly connected to generally constant voltage ground, the gate of the first bias switching NMOS being electrically coupled to the output of the first logic gate;
a second bias switching NMOS having a gate, a source and a drain, the source and the drain of the second bias switching NMOS being electrically coupled between the second buffer output and generally constant voltage ground, the source of the second bias switching NMOS being directly connected to generally constant voltage ground, the gate of the second bias switching NMOS being electrically coupled to the output of the second logic gate;
a first bias resistor coupled between the first buffer output and the drain of the first bias switching NMOS; and
a second bias resistor coupled between the second buffer output and the drain of the second bias switching NMOS.

8. The low power logic output buffer of claim 6, wherein the low power logic output buffer is formed in an integrated circuit (IC).

9. The low power logic output buffer of claim 6, wherein the first logic signal and the second logic signal are complementary.

10. The low power logic output buffer of claim 6, wherein the first logic signal and the second logic signal are clock (CLK) and complementary clock (/CLK).

11. The low power logic output buffer of claim 2, wherein the low power logic output buffer is formed in an integrated circuit (IC).

12. The low power logic output buffer of claim 2, wherein the first logic signal and the second logic signal are complementary.

13. The low power logic output buffer of claim 2, wherein the first logic signal and the second logic signal are clock (CLK) and complementary clock (/CLK).

14. The low power logic output buffer of claim 7, wherein the low power logic output buffer is formed in an integrated circuit (IC).

15. The low power logic output buffer of claim 7, wherein the first logic signal and the second logic signal are complementary.

16. The low power logic output buffer of claim 7, wherein the first logic signal and the second logic signal are clock (CLK) and complementary clock (/CLK).

* * * * *